United States Patent [19]

Carusillo

[11] Patent Number: 4,661,768
[45] Date of Patent: Apr. 28, 1987

[54] CAPACITANCE TRANSDUCING METHOD AND APPARATUS

[75] Inventor: Steven J. Carusillo, Elkhart, Ind.

[73] Assignee: Johnson Service Company, Milwaukee, Wis.

[21] Appl. No.: 774,796

[22] Filed: Sep. 11, 1985

Related U.S. Application Data

[63] Continuation-in-part of Ser. No. 532,017, Sep. 14, 1983, Pat. No. 4,558,274.

[51] Int. Cl.[4] ............ G01R 11/52; G01R 27/26
[52] U.S. Cl. .................................................. 324/60 C
[58] Field of Search ............ 324/60 R, 60 C, 60 CD; 73/724

[56]  References Cited

U.S. PATENT DOCUMENTS

| | | | |
|---|---|---|---|
| 3,460,032 | 8/1969 | Bement et al. | 324/60 R |
| 3,824,459 | 7/1974 | Uchida | 324/60 CD |
| 4,065,715 | 12/1977 | Jaffe et al. | 324/60 CD |
| 4,153,873 | 5/1979 | Grindeheim | 324/60 R |
| 4,187,460 | 2/1980 | Dauge et al. | 324/60 CD |
| 4,227,419 | 10/1980 | Park | 73/724 |
| 4,492,916 | 1/1985 | Johnson | 324/60 CD |

*Primary Examiner*—Stanley T. Krawczewicz
*Attorney, Agent, or Firm*—Larry L. Shupe; Joseph J. Jochman

[57] ABSTRACT

A signal generating circuit useful in determining the value of a capacitor includes a charging source having a resistive element and a plurality of switches, each switch being positionable between a first, open position and a second, closed position in response to logic signals. The switches are thereby controllable for sequentially connecting a first reference capacitor of known value and a second capacitor to the resistive element for charging said capacitors to a potential. An oscillating comparator network establishes a trigger reference voltage and generates a clocking pulse when the sequentially detected charge potential of the capacitors is equal to the trigger reference voltage. A logic network is connected to the comparator network for generating the logic signals in response to the clocking pulse and the logic network includes a network for resetting the signal generating circuit. Also included is means for determining a first time required to charge the first capacitor from an initially-depleted state to the trigger reference voltage and for determining a second time required to charge the second capacitor from an initially-depleted state to the trigger reference voltage. A method for determining the value of a capacitance is also disclosed.

4 Claims, 19 Drawing Figures

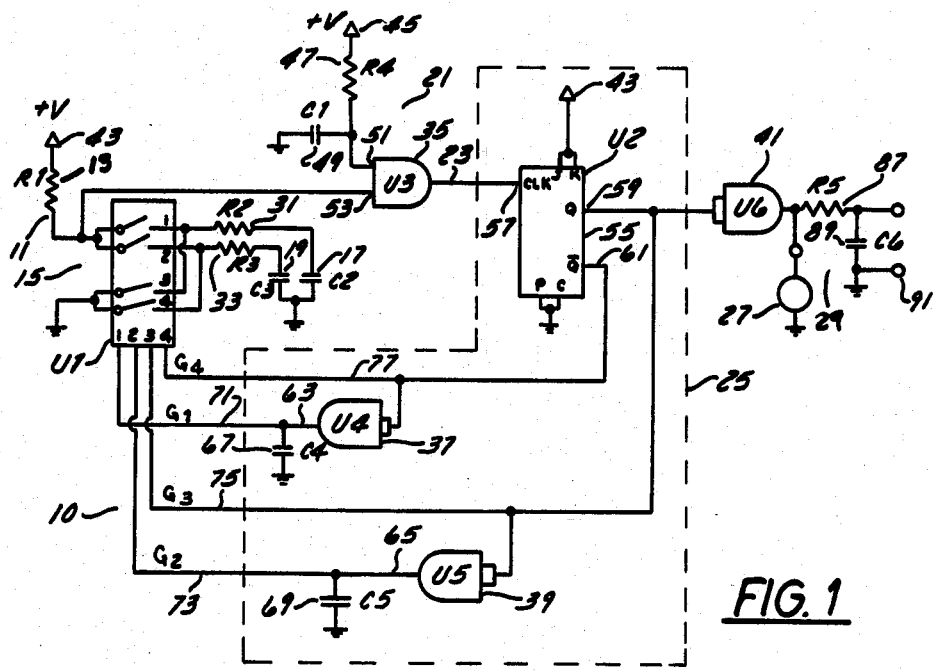
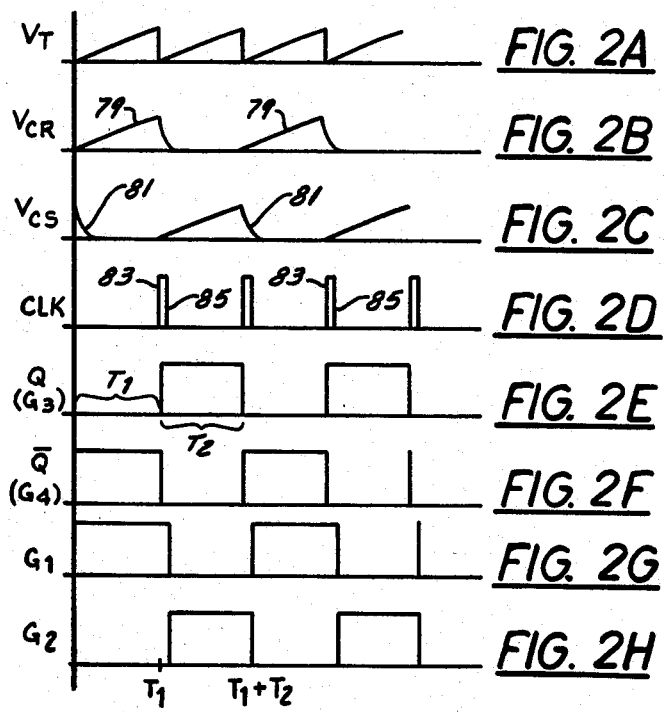

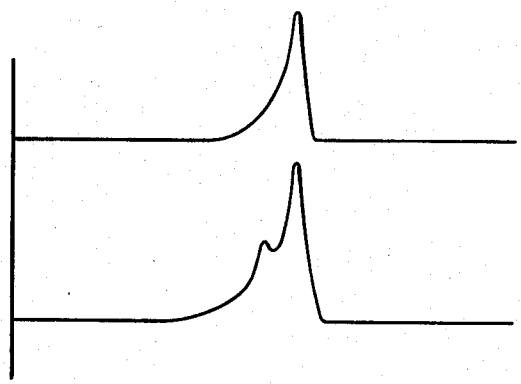
FIG. 5A
FIG. 5B
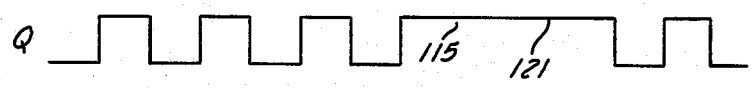
FIG. 7A
FIG. 7B
FIG. 7C
FIG. 7D
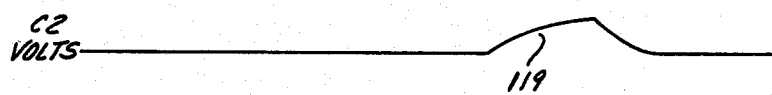
FIG. 7E

CAPACITANCE TRANSDUCING METHOD AND APPARATUS

This application is a continuation-in-part of application Ser. No. 532,017 now U.S. Pat. No. 4,558,274 filed on Sept. 14, 1983, titled "Apparatus and Method for Determining the Value of a Capacitance" and assigned to the same assignee as this application.

This invention relates generally to the art of electrical measurement and more specifically to an apparatus and method having reduced sensitivity to changes in ambient temperature and useful for determining by time sequencing, the value of an unknown capacitance.

BACKGROUND OF THE INVENTION

In the electrical arts, it is frequently desirable to determine the value of an unknown capacitor. Several approaches are known for making such a determination as, for example, that disclosed in U.S. Pat. No. 3,824,459 which describes an apparatus for finding the value of a capacitance by generating counted pulses representative thereof. The number of these generated pulses is dependent upon the accuracy of the determined values of a pair of resistors. Yet another example is shown in U.S. Pat. No. 4,065,715 which describes a circuit for simultaneously charging a reference capacitor of known value and a second capacitor of unknown value. Each capacitor is connected in parallel with its own resistor and the voltage across each capacitor is directed to a separate threshold detector. The value of the unknown capacitance is determinable by measuring the difference in time between that required to trigger the first detector and that required to trigger the second detector.

Yet another type of capacitance transducer is shown in U.S. Pat. No. 4,227,419. The circuit disclosed therein uses a common current source to charge either of two capacitors and provides an output pulse train having positive and negative portions, the durations of which are compared for determining the value of a varying capacitance with respect to a known, fixed capacitance. The apparatus uses two comparator-detector circuits for triggering a flip-flop circuit. Another circuit for measuring capacitance is shown and described in a bulletin titled "Capacitive Humidity Sensor, Technical Information 063", believed to have been published by U.S. Philips Corp. The circuit disclosed therein uses a free running multivibrator with a second multivibrator slaved thereto. These timing circuits generate pulses useful for capacitance determination. Each multivibrator uses a separate but nominally equal trigger voltage level and has a characteristic cyclic period which is dependent upon the value of a resistor dedicated to a particular multivibrator.

While these known devices and methods have heretofore been generally satisfactory, they tend to be characterized by certain disadvantages. In particular, they variously employ separate comparator circuits for triggering purposes, separate trigger voltage reference sources and/or separate resistive elements for capacitance determination. It is known to those in the electrical arts that certain characteristics of the surrounding ambient, most notably temperature, may affect the values of these components with a resultant loss in measurement accuracy. An apparatus and method useful in making capacitance measurements which employs a single, common resistive element for capacitor charging and a single voltage reference for generating a trigger or clocking pulse would be a significant advance in the art. The inventive apparatus and method are seen as being particularly useful in heating, ventilating and air conditioning (HVAC) applications where the value of the measured capacitance is representative of relative humidity, pressure, temperature or other parameter.

It is an object of the invention to provide an apparatus and method for capacitance measurement which overcomes the disadvantages of the prior art.

Another object of the present invention is to provide a capacitance measuring apparatus which utilizes a single, common resistive element for capacitor charging.

Yet another object of the invention is to provide an apparatus and method for capacitance measurement which utilizes a single, common trigger reference for generating clocking pulses useful in making such measurements.

Still another object of the present invention is to provide an apparatus and method for determining the value of a capacitor wherein the effect of changes in ambient temperature is reduced.

Another object of the present invention is to provide an apparatus and method for capacitance measurement which makes advantageous use of integrated circuitry. These and other objects of the invention will become more apparent from the detailed description thereof taken in conjunction with the accompaning drawing.

SUMMARY OF THE INVENTION

In general, an apparatus useful in determining the value of a capacitor includes a first bilateral switch for flowing a charging current through a resistive element to an initially-depleted first capacitor of known value. The first capacitor is thereby charged to the potential of a trigger reference over a resulting first time period. A second bilateral switch is provided for flowing a charging current through the same resistive element to an initially-depleted second capacitor, thereby charging it to the potential of the same trigger reference over a resulting second time period. A device such as an oscilloscope or frequency counter is used for determining these time periods and the value of the unknown second capacitor may thereupon be computed using disclosed formulas.

A method for determining the value of a capacitor includes the steps of flowing a charging current through a resistive element to an initially-depleted first capacitor of known value, thereby charging this capacitor to the potential of a trigger reference over a resulting first time period. A charging current is then caused to flow through the same resistive element to an initially-depleted second capacitor for charging it to the potential of the trigger reference over a resulting second time period. The value of the second capacitor is then computed by utilizing the first time period, the second time period and the value of the first capacitor.

BRIEF DESCRIPTION OF THE DRAWING

FIG. 1 is a simplified schematic circuit diagram of one embodiment of the apparatus of the present invention;

FIGS. 2A–2H inclusive comprise graphical representations of voltage traces and logic signal states which appear at particular points of the circuit of FIG. 1;

FIG. 5A is a greatly enlarged graphical depiction of a normal clocking pulse;

FIG. 5B is a greatly enlarged graphical depiction of a clocking pulse, the shape of which is adversely affected by spurious electrical noise;

FIGS. 7A–7E inclusive comprise graphical representations of voltage traces and logic signal states which appear at particular points of the circuit diagram of FIG. 6.

DETAILED DESCRIPTION OF THE PREFERRED EMBODIMENTS

Figure 4:
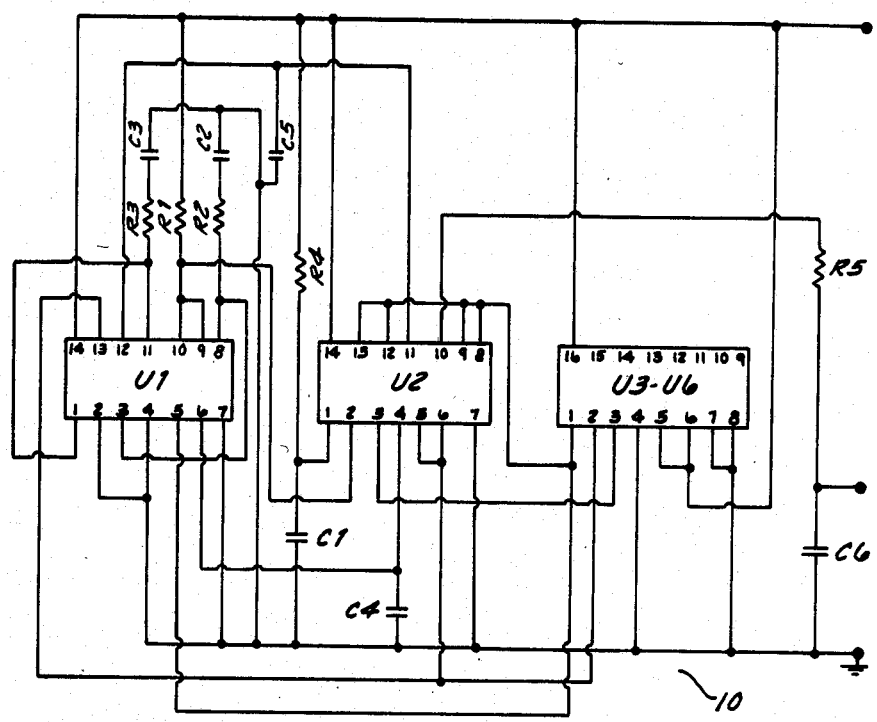
FIG. 4 represents an embodiment of the inventive apparatus of FIG. 1 using integrated circuit technology.

Referring first to FIG. 1, the inventive circuit apparatus 10 is shown to include a charging source 11 having a resistive element 13 and a plurality of switches 15, each switch being positionable between a first, open position and a second, closed position in response to logic signals. The switches 15 are thereby controllable for sequentially connecting a first reference capacitor 17 of known value and a second capacitor 19 of unknown value to the resistive element 13 for charging the capacitors 17, 19 to a voltage potential. A voltage reference 21 having a predetermined input voltage generates a clocking pulse at the clock line 23 when the sequentially detected charge potential of each of the capacitors 17, 19 is equal to the predetermined trigger voltage established by the reference 21. A logic network 25 is included for generating the logic signals in response to the clocking pulse. A time-determining means 27 such as an exemplary oscilloscope or event (frequency) counter may be coupled to the logic network 25 for determining the first time required to charge the first capacitor 17 from an initially-depleted state to the predetermined potential of the reference 21. The oscilloscope may also be used for determining the second time required to charge the second capacitor 19 from an initially-depleted state to the predetermined potential. The first time, the second time and the value of the reference capacitor 17 may then be used to compute the value of the unknown capacitor 19 in accordance with disclosed formulas. In the alternative and in lieu of the oscilloscope, a filtering network 29 may be employed for filtering one of the logic signals to its average DC value which will be representative of the value of the unknown capacitor 19. Resistors 31 and 33 are connected in series with the first capacitor 17 and the second capacitor 19 respectively for limiting the resulting current during capacitor discharge. While the preferred embodiment of the circuit apparatus 10 is as shown in FIG. 4 wherein the switches 15 are embodied as a CMOS integrated chip and the comparators 35, 37, 39 and 41 are embodied as a single integrated chip, the operation of the circuit 10 will be more readily understood by reference to FIG. 1 where the switches 15 are represented as simple, two position devices of the conventional, mechanical type.

More particularly, the charging source 11 includes a source of input voltage 43 at a constant potential and a resistive element 13 coupled in series with the input voltage source 43. This source 43 will cause a charging current to flow to either the first capacitor 17 or the second capacitor 19, depending upon the position of the switches 15. In a preferred embodiment, the resistive element 13 is selected to have a resistance value several hundred times greater than that of either of the current limiting resistors 31, 33 and in the illustrated embodiment, a resistive ratio of 470:1 is used.

The voltage reference includes a connection 45 to the input voltage source 43 and a reference comparator 35 embodied as an AND gate for generating a clocking pulse at the clock line 23. A resistor 47 and capacitor 49 are included for providing a slight time delay upon initial startup in order to maintain the clock line 23 at logic "0" until all integrated circuit components have reached equilibrium. The comparator 35 senses the voltage value of the input voltage source 43 at its first terminal 51, the value of the charge voltage of either the first capacitor 17 or the second capacitor 19 at its second terminal 53 and generates a clock pulse whenever the value of a capacitor charge voltage rises to be equal to that of the trigger reference voltage. In the illustrated embodiment, this trigger reference voltage will be about one-half the voltage value of the input source 43.

The logic network 25 preferably includes a J-K flip-flop circuit 55 embodied as a CMOS integrated chip which is configured as a toggle flip-flop by coupling the J-K input terminals to the common source of input voltage 43. The flip-flop 55 includes a pulse input terminal 57, a first logic output terminal 59 and a second logic complement output terminal 61. These output terminals 59, 61 are coupled to a first logic gate 39 and a second logic gate 37 respectively. Since each of the input terminals of the logic gates 37, 39 are connected together, the logic states of the gate output terminals, 63 and 65 respectively, will each be identical to the logic state of their input terminals. The logic gates 37, 39 and their associated capacitors 67, 69 respectively provide a slight time delay to prevent, for example, the simultaneous closure of switches 1 and 2, an event which would corrupt the result of the capacitance measurement. The inclusion of these time delay devices is convenient since a readily available AND gate comparator integrated circuit includes four such comparators therewithin but resistors could be effectively substituted therefor. When constructed and arranged as shown, the flip-flop 55 and the logic gate outputs define a plurality of logic lines including the first, second, third and fourth logic lines 71, 73, 75, 77 respectively. It is to be appreciated that the instantaneous position of any switch is governed by the then-existing logic state of its associated logic line. For example, if logic line 71 is at logic "0", the switch labelled "1" will be in the open position as shown.

Before describing the operation of the circuit apparatus 10, several circuit characteristics and assumed initial conditions will be set forth. In the preferred embodiment, the internal resistive value of each of the switches 15 is on the order of 80 ohms. Further, the value of the resistive element 13 is selected to be substantially greater than the value of either of the current limiting resistors 31, 33 as described above and the value of either of the current limiting resistors 31, 33 is, in turn, substantially greater than the internal resistance of any switch. With respect to the initial conditions, the input voltage source 43 is assumed to be maintained at a constant voltage level, an exemplary 10 VDC, logic lines 71 and 77 are at logic "1", logic lines 73 and 75 are at logic "0", the first capacitor 17 is at a charge-depleted state of 0 VDC and the second capacitor 19 is charged to a voltage nominally equal to the trigger reference voltage of the reference comparator 35, 5 VDC for example.

Given these initial conditions and at a first instant of time, arbitrarily designated time zero, the first capacitor 17 will commence exponential charging to the value of the input voltage source in accordance with a time constant represented by the formula $TC = C2(R1 + R2 + RS1)$ where RS1 is the resistive value of the switch "1". Simultaneously, the second capacitor 19 will commence discharging in accordance with a time constant represented by the formula $TD = C3(R3 + RS4)$ where RS4 is the resistive value of the switch "4". In view of the aforementioned resistive relationships, the charging time constant of the first capacitor 17 is determined almost entirely by the value of the resistive element 13(R1) in accordance with formula $TC = C2(R1)$ while the discharge time constant of the second capacitor 19 is determined almost entirely by the value of the second current limiting resistor 33(R3) in accordance with the formula $TD = C3(R3)$. Since the value of the second capacitor 19 is known to generally approximate that of the first capacitor 17 and since the value of the resistive element 13 is much greater than that of the second current limiting resistor 33, the time required to charge the first capacitor 17 is much greater than that required to discharge the second capacitor 19 as is illustrated in FIGS. 2B and 2C where the charging curve 79 for the first capacitor 17 is plotted against the discharging curve 81 of the second capacitor 19 immediately subsequent to the aforementioned initial conditions.

The first capacitor 17(C2) continues charging until the voltage at the second input terminal 53 is equal to the trigger reference voltage whereupon the comparator gate 35 generates a logic "1" signal in the form of a rising edge 83 of a clocking pulse as shown in FIG. 2D. The time T1 required for the first capacitor 17 to attain a charge equal to the trigger reference voltage is closely approximated by the formula $T1 = -C2(R1) \ln(\frac{1}{2})$. Upon the occurrence of the rising edge 83 of the clocking pulse, the logic states of the first output terminal 59 and the second output terminal 61 are caused to toggle, the logic state of the first output terminal 59 changing from logic "0" to logic "1" and that of the second output terminal 61 changing from logic "1" to logic "0". Upon toggling, the switches "1" and "3" are closed and the switches "2" and "4" are opened whereupon the first capacitor 17 commences discharging as shown in the decaying portion of the curve of FIG. 2B. This is so, notwithstanding the fact that the first capacitor 17 is still connected to the resistive element 13 since that element 13 has a value very much greater than that of the first current limiting resistor 31. Upon toggling, the second capacitor 19 is maintained in a charged-depleted state. Nearly instantaneously, the voltage at the second input terminal 53 falls below the trigger reference level and the output terminal or clocking line 23 of the gate 35 will go to logic "0" as represented by the falling edge 85 of FIG. 2D. It is to be appreciated that the apparent time to discharge the second capacitor 19 as shown in the decaying portion of the curve of FIG. 2C and the time width of the clocking pulse as represented in FIG. 2D have been greatly exaggerated for purposes of explanation.

Since the flip-flop 55 has been configured to toggle only upon a rising edge 83 of a clocking pulse, the only change occasioned by the discharge of the first capacitor 17 below the trigger reference level is that the state of clock line 23 is changed to logic "0". The states of logic lines 71, 73 change from logic "1" to logic "0" and from logic "0" to logic "1" respectively after a brief time delay caused by the charging of two gate capacitors 67, 69, one of which is coupled to each logic gate 37, 39. With the described changes of state of logic lines 71, 73, 75 and 77, switches "1" and "4" are open and switches "2" and "3" are closed, these positions being the complement of the initial, assumed condition. Thereupon, the second capacitor 19(C3) commences charging in accordance with a charging time T2 closely approximated by the formula $T2 = -R1(C3) \ln(\frac{1}{2})$. The cycle then repeats.

Referring to FIGS. 2E and 2F, the respective logic states of the first logic terminal 59 and the second logic terminal 61 are graphically represented while FIGS. 2G and 2H graphically represent the logic states of logic lines 71 and 73, respectively. An examination of the timing diagram of FIG. 2E illustrates that when the value of the second capacitor 19 is equal to that of the first capacitor 17, the signal at the first logic terminal 59 has a 50% duty cycle D, i.e., is at logic "0" and logic "1" states for equivalent time periods; $T1 = T2$. When the value of the second capacitor 19 is unequal to that of the first capacitor 17, the duty cycle D may be computed using the formula $D = T2$ divided by $(T1 + T2)$. Thereupon, the value of the unknown, second capacitor 19 may be computed using an oscilloscope or similar device to measure time.

In the alternative and in lieu of using an oscilloscope, the logic signal may be converted to its average DC value by passing it through a buffer comparator 41 and a filter comprised of a resistor 87 and a capacitor 89. The average DC value may then be measured accross the output terminals. Those skilled in the art will appreciate that the value of the capacitor C2 may also be determined by frequency measurements made at the output terminals, employing a frequency counter or a microprocessor. One may also couple a counter to the clock line for counting alternate pulses. If average DC output is used for capacitance measurement, the value of the second capacitor 19 may be computed in accordance with the formula C3 equals (C2)(VAO) divided by (VI−VAO) where VAO is the average DC output voltage and VI is the value of the potential of the input source 43. On the other hand, if frequency is desired to be used for capacitance measurement, the value of the second capacitor 19 may be computed in accordance with the formula $$C3 \text{ equals } - \left[ C2 + \frac{1}{fR1 \ln\left(1 - \frac{VTR}{VI}\right)} \right]$$

where f is frequency in Hertz and VTR is the value of the trigger reference voltage. Capacitances are in picofarads, voltages are in volts and resistance is in ohms.

Figure 3:
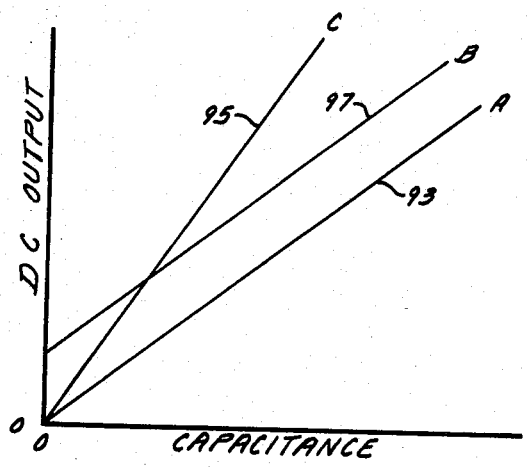
FIG. 3 is a simplified graph representing the error-generating effect of changes in ambient temperature upon capacitance measurement.

Referring to FIG. 3, there is shown a typical operating line 93 for the apparatus 10 and method of the invention. An error in gain caused by changes in ambient temperature and resulting temperature coefficient mismatches would be represented by line 95 while a zero error would be represented by curve 97. Assuming that the full scale range of the capacitor 19 is on the order of 150–180 picofarad and further assuming a shift in the temperature of the ambient surrounding the apparatus 10 of 100 degrees F., it has been found that the inventive apparatus 10 and method results in a substantial improvement in measurement accuracy over that available with the measurement apparatus of the aforementioned Technical Information 063. For example and with respect to errors due to changes in resistance over the described temperature shift, the apparatus of the Information yielded about plus or minus 5% zero error and plus or minus 1% gain error. In contrast, the inventive apparatus 10 yielded less than 1% and less than 0.1% zero and gain error respectively. Similarly, the resulting change in the level of the input voltage source 43 was about plus or minus 3% zero error and plus or minus 0.6% gain error for the apparatus of the Information and nominally 0% zero and gain error for the inventive apparatus 10.

Figure 6:
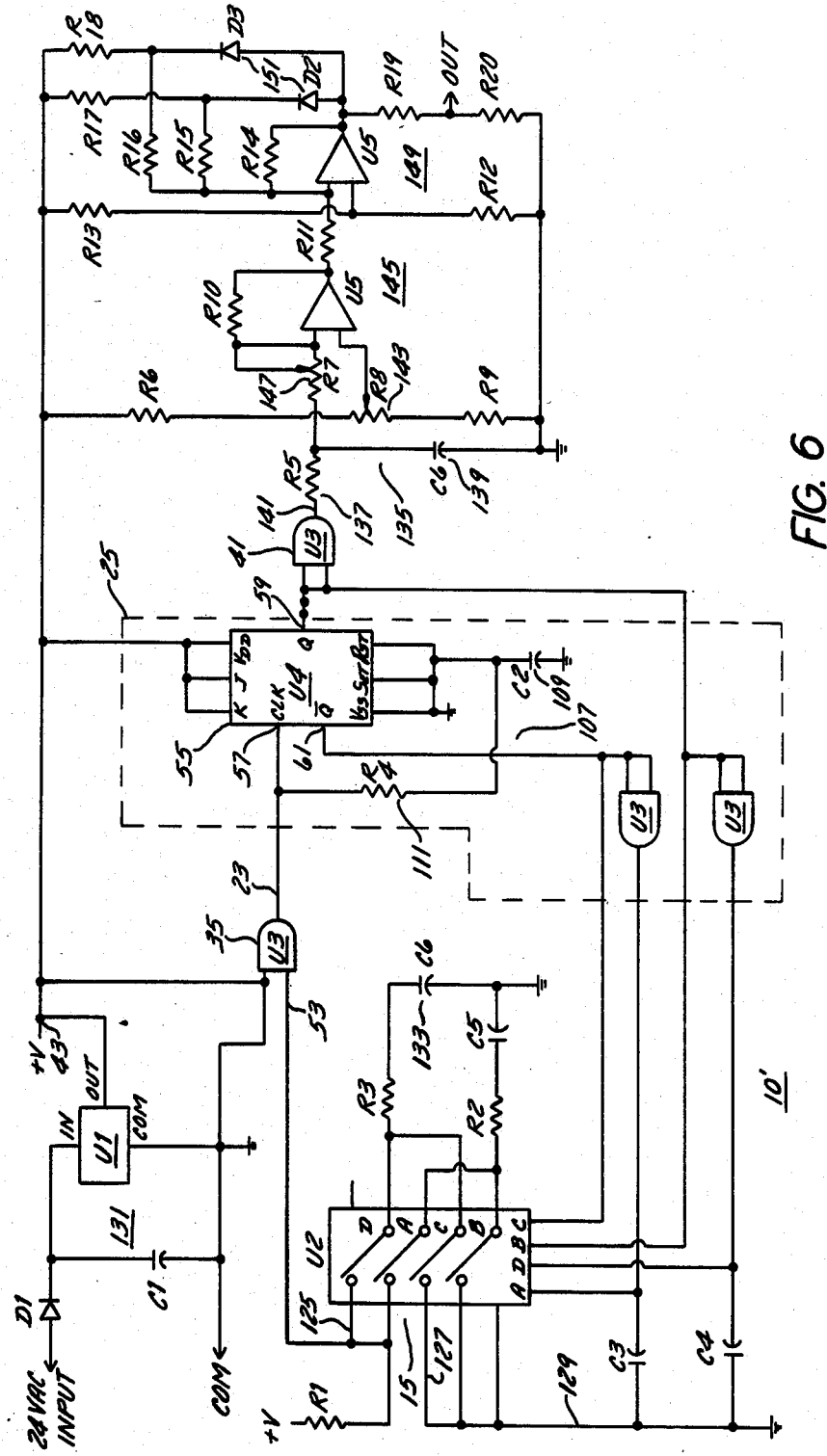
FIG. 6 is a simplified schematic circuit diagram of another embodiment of the apparatus of the invention.

Referring to FIGS. 1 and 6 and particularly to FIG. 1, a purpose of the R-C circuit embodied as resistor 47 and capacitor 49 is to cause the comparator 35 to provide an oscillator function after a brief time delay upon startup. This R-C circuit introduces a time delay such that terminal 51 of comparator 35 is held at a logic "0" for a short duration until the circuit U1 and flip-flop 55 reach equilibrium. This delay operates to maintain line 23 at a logic "0" state until the lapse of the delay, at which time a clocking pulse will be generated at line 23 as represented by FIG. 2D and the configuration of a normal clocking pulse is graphically represented by FIG. 5A. In certain circumstances which may be occasioned by spurious electrical noise, the configuration of the clocking pulse may be graphically represented by FIG. 5B. It will be recalled that terminals 59 and 61 will each experience a change of logic state with each rising edge of a clock pulse. In the case of a pulse as in FIG. 5B, the flip-flop 55 will interpret the pulse to be two clock pulses closely spaced in time and the logic state of terminals 59, 61 at the end of the pulse of FIG. 5B will be the same as at its beginning. Because of this close time spacing, the apparatus 10' does not detect the change and ceases to function. The foregoing is graphically depicted in FIGS. 7A-7E.

Referring particularly to FIG. 6, this condition may be negated by the inclusion of an R-C reset network 107 connected as shown and comprising capacitor 109 and resistor 111. Understanding of the operation of the apparatus 10' which includes the reset network 107 will be aided by further reference to FIGS. 7A-7E where the adverse effect of spurious noise may first evidence itself by a clock signal at line 23 (FIG. 7D) which is maintained at a logic "1" state as shown in the region 113. One manifestation of this event is that terminal 59 is maintained at logic "1" and terminal 61 is maintained at logic "0", as shown in the regions 115 and 117 of FIGS. 7A, 7B respectively. With line 23 maintained at logic "1", the charge voltage of the capacitor 109 rises as shown in region 119 of FIG. 7E and at some threshold value of charge voltage, the SET-RESET terminals of flip-flop 55 are set at logic "1". This causes terminal 59 to be maintained at logic "1" and terminal 61 to be set at logic "1" as seen at points 121, 123 respectively. In turn, switches 15a–d are caused to close to establish a ground path for line 53, one of which is shown in FIG. 6 to include line 125, switches 15d and 15c and lines 127 and 129. Grounding of line 53 brings line 23 to logic "0". This permits the capacitor 109 to discharge and operation thereafter proceeds normally. The voltage logic states of terminals 59, 61 and of line 53 during this activity are as shown in FIGS. 7A, 7B and 7C respectively.

It will be appreciated that the apparatus 10' represented by FIG. 6 is closely similar to that of FIG. 1 and further includes a voltage rectifying and regulation section 131 and a relative humidity sensor embodied as a capacitive sensor 133. This humidity sensing function is merely illustrative of one of the uses of the invention. The apparatus 10' also includes a conversion stage 135 having a resistor 137 and a capacitor 139 for converting the buffered square wave output emanating from terminal 141 of comparator 41 to a DC valve, e.g., 7.5 V., which will vary by an exemplary 100 MV. with changes in relative humidity as sensed by the capacitor 133. A potentiometer 143 permits calibration of the first amplifying stage 145 to provide, for example, a reference of 1 V. output at 10% relative humidity. A second potentiometer 147 permits gain adjustment while the second amplifying stage 149 also includes diodes 151 for providing linearization.

The following component values have been found useful in the present invention where resistance is in ohms, tolerance 1%; capacitance is in microfarads, tolerance 20%, all unless otherwise indicated.

| FIGS. 1,4 | | | |
|---|---|---|---|
| R1 | 470K | R2, R3 | 1K |
| R4 | 560K, 5% | R5 | 100K |
| C1 | 0.1 | C3 | 150 pf matched to temp. coeff. of C2 |
| C4, C5 | 0.001 | C6 | 0.01 |
| U1 | 4066 | U2 | 4027 |
| U3-U6 | 4081 | | |
| FIG. 6 | | | |
| C1 | 100 mf, 50 V | C2 | 470 pf |
| C3, C4 | .001 mf | C5 | 100 pf |
| C6 | 1.5 mf | D1 | 1N5060 |
| D2, D3 | 1N4148 | R1 | 330K |
| R2, R3, R8 | 1K | R4 | 56K |
| R5 | 56K | R6, R9 | 3.3K |
| R7 | 50K | R10 | 220K |
| R11 | 2K | R12, R15, R16 | 10K |
| R13 | 22K | R14 | 4.7K |
| R17 | 33K | R18 | 27K |
| R19 | 820 | R20 | 220 |
| U1 | 78L15 | U2 | 4066B |
| U3 | 4081 | U4 | 4027B |
| U5 | 358 | | |

While only a few preferred embodiments of the inventive circuit apparatus 10 and method for determining capacitance value have been shown and described, the invention is not intended to be limited thereby but only by the claims which follow.

I claim:

1. A signal generating circuit useful in determining the value of a capacitor and including:
   a charging source including a resistive element;
   a plurality of switches, each switch being positionable between a first, open position and a second, closed position in response to logic signals, said switches thereby being controllable for sequentially connecting a first reference capacitor of known value and a second capacitor to said resistive element for charging said capacitors to a potential;
   an oscillating comparator network for establishing a trigger reference voltage and generating a clocking pulse when the sequentially detected charge potential of said capacitors is equal to said trigger reference voltage;
   a logic network connected to said comparator network for generating said logic signals in response to said clocking pulse, said logic network including a network for resetting said signal generating circuit, and;

means for determining a first time required to charge said first capacitor from an initially-depleted state to said trigger reference voltage and for determining a second time required to charge said second capacitor from an initially-depleted state to said trigger reference voltage.

2. The invention set forth in claim 1 wherein said resetting network includes a capacitor chargeable to a reset voltage, thereupon grounding a terminal of said comparator network for re-initializing said clocking pulse.

3. An electrical circuit useful in determining the value of a capacitor including:
- a first bilateral switch for flowing a charging current through a resistive element to an initially-depleted first capacitor of known value, thereby charging said first capacitor to the potential of a voltage reference over a resulting first time;
- a second bilateral switch for flowing a charging current through said resistive element to an initially depleted second capacitor, thereby charging said second capacitor to said potential over a resulting second time;
- means for determining said times;
- said voltage reference including a reference comparator for establishing a trigger reference voltage and having a first comparator input terminal for sensing a voltage source at a potential and a second comparator input terminal for sequentially sensing the charge potential of said capacitors and means for generating an intermittent clocking pulse of logic "1" state when said charge potential is equal to said trigger reference voltage;
- said electrical circuit further including a logic network for generating logic signals in response to said clocking pulse, said bilateral switches being positionably responsive to said logic signals, said logic network having a reset capacitor chargeable to a reset voltage for re-initializing said clocking pulse in the event said pulse becomes set at a logic "1" state.

4. A method for determining the value of a capacitor and including the steps of:
- providing a source of charging voltage having a resistive element coupled in series therewith;
- connecting an initially-depleted reference capacitor to said resistive element at a first time for charging said reference capacitor to a reference voltage;
- generating a first clocking signal at a pulsed logic "1" state when said reference capacitor is charged to said reference voltage;
- connecting an initially-depleted second capacitor to said resistive element at a second time for charging said second capacitor to said reference voltage;
- generating a second clocking signal at a pulsed logic "1" state when said second capacitor is charged to said reference voltage;
- measuring the elapsed times between said first time and said first clocking signal and between said first clocking pulse and said second clocking signal;
- computing a duty cycle utilizing said elapsed times;
- providing a reset network for detecting when a clocking signal is maintained at a logic "1" state, said reset network thereupon coacting with a logic network for grounding a terminal of an oscillating comparator network, thereby switching said clocking signal to a logic "0" state.

* * * * *